(12) United States Patent
Lu et al.

(10) Patent No.: US 7,198,479 B2
(45) Date of Patent: Apr. 3, 2007

(54) EJECTOR WITH MULTI-EJECTION PINS

(75) Inventors: Weng-Jung Lu, Hsinchu (TW);
Chao-Hsien Huang, Pan Chiao (TW);
Kuo-Chung Huang, Hsinchu (TW);
Hung-I Lin, Pin Tung (TW);
Ying-Fang Chang, Taipei (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 307 days.

(21) Appl. No.: 10/980,317

(22) Filed: Nov. 4, 2004

(65) Prior Publication Data

US 2006/0093698 A1 May 4, 2006

(51) Int. Cl.
*B29C 45/40* (2006.01)
(52) U.S. Cl. ............... 425/437; 425/577; 425/DIG. 60
(58) Field of Classification Search ............... 425/437, 425/405.1, 438, 577, DIG. 60, DIG. 102; 264/102
See application file for complete search history.

(56) References Cited

U.S. PATENT DOCUMENTS

| | | | | |
|---|---|---|---|---|
| 4,009,978 A | * | 3/1977 | Hanning | 425/98 |
| 4,212,623 A | * | 7/1980 | Allen | 425/547 |
| 4,573,900 A | * | 3/1986 | Smith | 425/157 |
| 4,806,088 A | * | 2/1989 | Busch et al. | 425/127 |
| 4,861,534 A | * | 8/1989 | Boehm et al. | 264/102 |
| 5,849,237 A | * | 12/1998 | Inoue | 264/319 |
| 6,129,881 A | * | 10/2000 | Puniello | 264/278 |
| 6,422,850 B1 | * | 7/2002 | Shannon et al. | 425/116 |
| 6,817,852 B2 | * | 11/2004 | Lavallee | 425/116 |
| 6,877,974 B2 | * | 4/2005 | Puniello et al. | 425/116 |

FOREIGN PATENT DOCUMENTS

TW 298667 2/1997
TW 470210 12/2001

* cited by examiner

*Primary Examiner*—Joseph S. Del Sole
*Assistant Examiner*—Emmanuel S. Luk
(74) *Attorney, Agent, or Firm*—Rabin & Berdo, P.C.

(57) ABSTRACT

An ejector with multi-ejection pins is used in the post-processes of the semiconductor industry and is used by a selection device to choose a predetermined quantity of ejection pins. When a propelling device lifts the selection device, a pin-base vertical driver controls the vertical motion of a pin base, and a pin-base motion device controls the planar motion of the pin base; the chosen ejection pins can be lifted to elevate the respective dies for separation from adhesive film.

8 Claims, 8 Drawing Sheets

EJECTOR WITH MULTI-EJECTION PINS

BACKGROUND OF THE INVENTION

1. Field of the Invention

The present invention relates to an ejector with multi-ejection pins, and particularly relates to an ejector with multi-ejection pins for lifting a plurality of dies outwardly in order to them separate from adhesive film.

2. Background of the Invention

IC (Integrated circuit) package assembly is the downstream supply of the IC industry. A wafer is separated from individual dies after the pre-processes are completed, and the dies are disposed on respective die pads arranged on a carrier adhesive tape for wrapping. The IC package assembly provides functions of environmental resistance, die support, electric conduction and further heat dissipation to increase an additional value of the IC product.

Behind a fabricated wafer is an adhesive film (a so-called 'blue adhesive film') for die mounting. The blue adhesive film keeps the sawed wafer (individual dies) arranged regularly. During the die bonding procedure, the individual dies are separated and removed from the blue adhesive film individually for post-processes. The individual dies are put on respective lead frames sequentially and are secured with silver epoxy. Each of the individual dies is attached to the respective die pad of the lead frame, which extends inner leads and outer leads. The carrier adhesive film is reeled in advance and fed in the lead frames (die pads). Before the dies are put onto the die pad, the silver epoxy is dispensed in advance on the die pad; the dies are lifted in turn by an ejector with only a single ejector pin to remove from the blue adhesive film. They are further picked by the pick and place machine in order to be stuck onto the die pads, respectively.

A rapid pick and place mechanism is the key technology in die bonding equipments or die array machines. Because of the various sizes and various positions of the die pads of the different carrier adhesive films, the rapid pick and place mechanism should match the carrier adhesive film with different designs in order to deliver and orientate the dies onto the respective die pads. A lift of the die is the key point of the rapid pick and place mechanism, because the die's pitch is short and the die is brittle, the lift force needs to be carefully controlled to avoid damaging the die. A more recent method to prevent the die from cracking is reading the wafer test result directly to judge whether or not the die has been ejected, thereby increasing the efficiency of the die bonding process.

With respect to TW Patent No. 298667, a die ejector having an inhalation body with a die pad is disclosed. An ejection pin is arranged inside the inhalation body. The inhalation body and the ejection pin are driven individually by first and second motors alternatively for ascent and descent. However, this conventional device can only single arrange one pin at a time and as such is incompatible with mass production methods. Additionally, the conventional device is obviously complicated and huge and a number of the devices used for lifting multiple dies cannot operate together simultaneously.

With respect to TW Patent No. 470210, a die ejector is disclosed with two ejecting sections, one of which is a pre-ejection section. This conventional device makes the ejecting motion more stable and higher and further protects the lifted die. This conventional device can also only arrange a single pin at a time and as such is incompatible with mass production methods.

The die throughput of the die bonding equipment or the die array machine is more than 8000~10000 pieces per unit time. For mass production, if a plurality of dies can be rapidly picked and placed simultaneously, the process will be more commercially beneficial.

Hence, an improvement over the prior art is required to overcome the disadvantages thereof.

SUMMARY OF INVENTION

The primary objective of the invention is therefore to specify an ejector with multi-ejection pins that is adapted for a semiconductor post-process and can lift a plurality of dies simultaneously, in order to increase the efficiency of the relevant equipment and to improve commercial benefits.

The secondary objective of the invention is therefore to specify an ejector with multi-ejection pins; the ejector can select ejector pins individually for die choice, so as to save materials and increase manufacturing efficiency.

According to the invention, these objectives are achieved by an ejector with multi-ejection pins for lifting a plurality of dies outwards in order to separate from them from adhesive film, and the ejector includes a pin base, a pin-base vertical driver and a pin-base motion device connecting the pin base. The pin base includes an inhalation device which sucks the adhesive film, a plurality of ejection pins arranged inside the inhalation device, a selection device disposed under the inhalation device and controlling each of the ejection pins individually, and a propelling driver which pushes the selection device. The pin-base vertical driver controls the pin base for ascent and descent. The pin-base motion device controls the pin base to align the ejection pins with the respective dies. The selection device chooses a predetermined quantity of ejection pins individually, the propelling driver then elevates the selection device, the pin-base vertical driver controls the pin base to move vertically, and the pin-base motion device controls the pin base to rotate and performs a two-dimensional planar move. At this stage, the inhalation device stretches the adhesive film by drawing the adhesive film towards the selection device. The selection device then chooses the respective ejection pins and pushes the chosen ejection pins upwardly via the propelling driver, so as to force the chosen ejection pins to lift the adhesive film so the die can be removed.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE EMBODIMENTS

Figure 1:
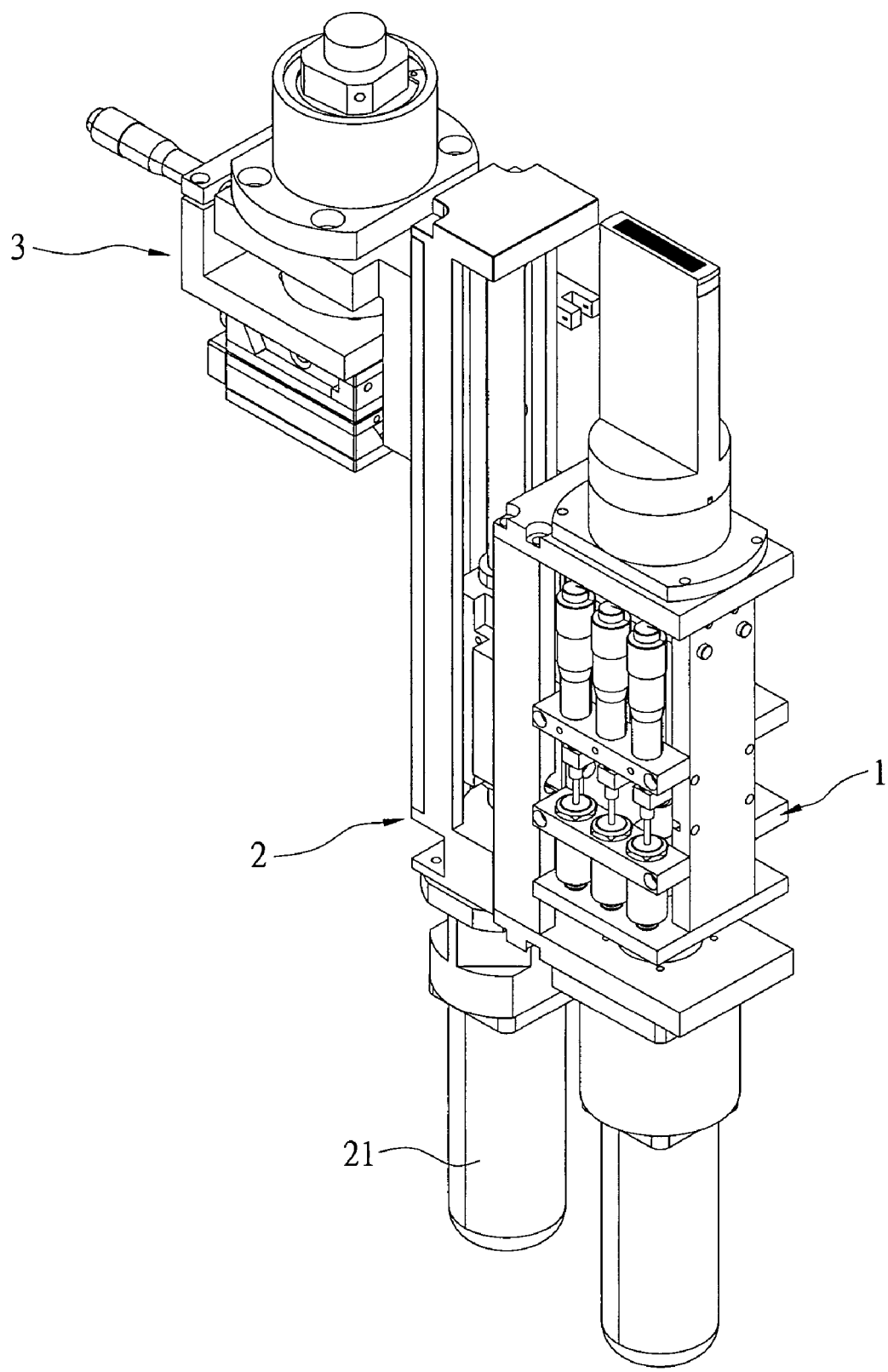
FIG. 1 is a perspective view of an ejector with multi-ejection pins.

Regarding FIG. 1, an ejector with multi-ejection pins is disclosed to be used in the post-processes of the semiconductor industry, such as die sorting, die mounting, or similar processes, for lifting a plurality of dies outwards in order to separate them from adhesive film. The ejector includes a pin base 1, a pin-base vertical driver 2 connecting the pin base 1 and controlling the pin base 1 for ascent and descent, and a pin-base motion device 3 connecting the pin base 1 and controlling the pin base 1 to align the ejection pins 111 (in FIG. 11) with the respective dies. The pin-base motion device 3 is used to array and to position the ejection pins 111, in order to align with the respective dies. The pin base 1 is used to lift the ejection pins 111, and further suck the adhesive film onto a surface thereof. In addition, a predetermined quantity of ejection pins 111 is chosen individually according to the present invention. The pin-base vertical driver 2 equipped with a servomotor and an interface which connects the pin base 1 and the pin-base motion device 3. The servomotor drives the pin base 1 for vertical elevation and descent, and that means the servomotor can adjust the position of the pin base 1 to suck the adhesive film via the inhalation device (FIG. 3).

Figure 2:
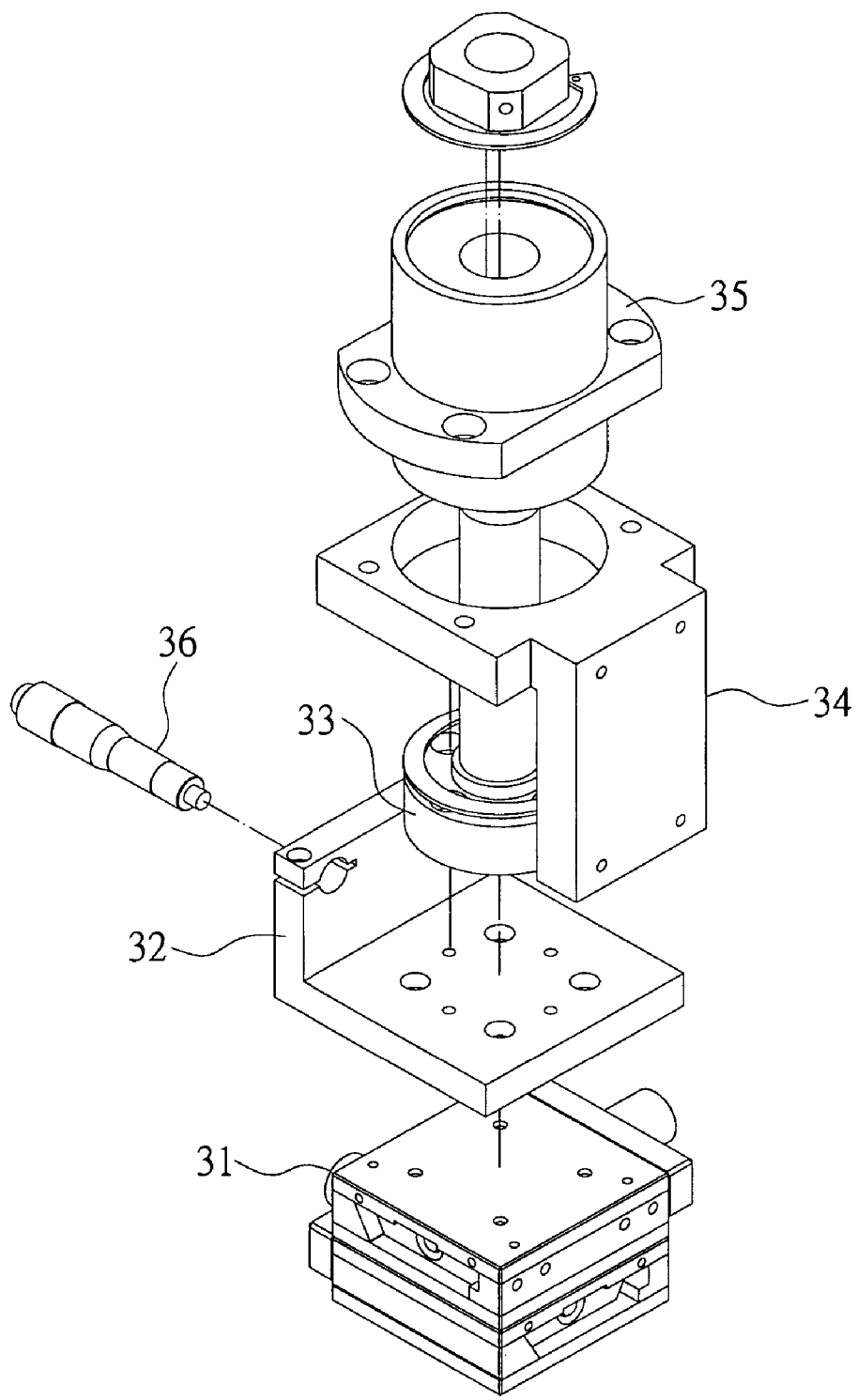
FIG. 2 is a decomposition view of a pin-base motion device according to the present invention.

A preferred embodiment of the pin-base motion device 3 is illustrated in FIG. 2. The pin-base motion device 3 includes a XY table 31, a connection plate 32 disposed on the XY table 31, an axial member 33 arranged on the XY table 31, a connection member 34 pivoting to the axial member 33 and disposed on a lateral side of the pin-base vertical driver 2, and an adjusting screw 36 driving the connection member 34 to rotate about the axial member 33. The principle of the pin-base motion device 3 is that the axial member 33 is fixed on the connection plate 32, a bearing member 35 is used to attach to the connection member 34, so that the connection member 34 can rotate relative to the connection plate 32. The XY table 31 can be controlled to provide two-dimensional planar motion of the connection member 34, and the adjust screw 36 can be controlled to rotate the connection member 34 about the axial member 33, so as to drive the pin-base vertical driver 2 and the pin base 1, which are connected to the pin-base motion device 3.

The pin-base vertical driver 2 includes a vertical driving motor 21 (in FIG. 1), an orientation member 22 (in FIG. 3) connecting to the pin-base motion device 3, and a mold plate 23 (in FIG. 3) connecting to the pin base 1.

Figure 3:
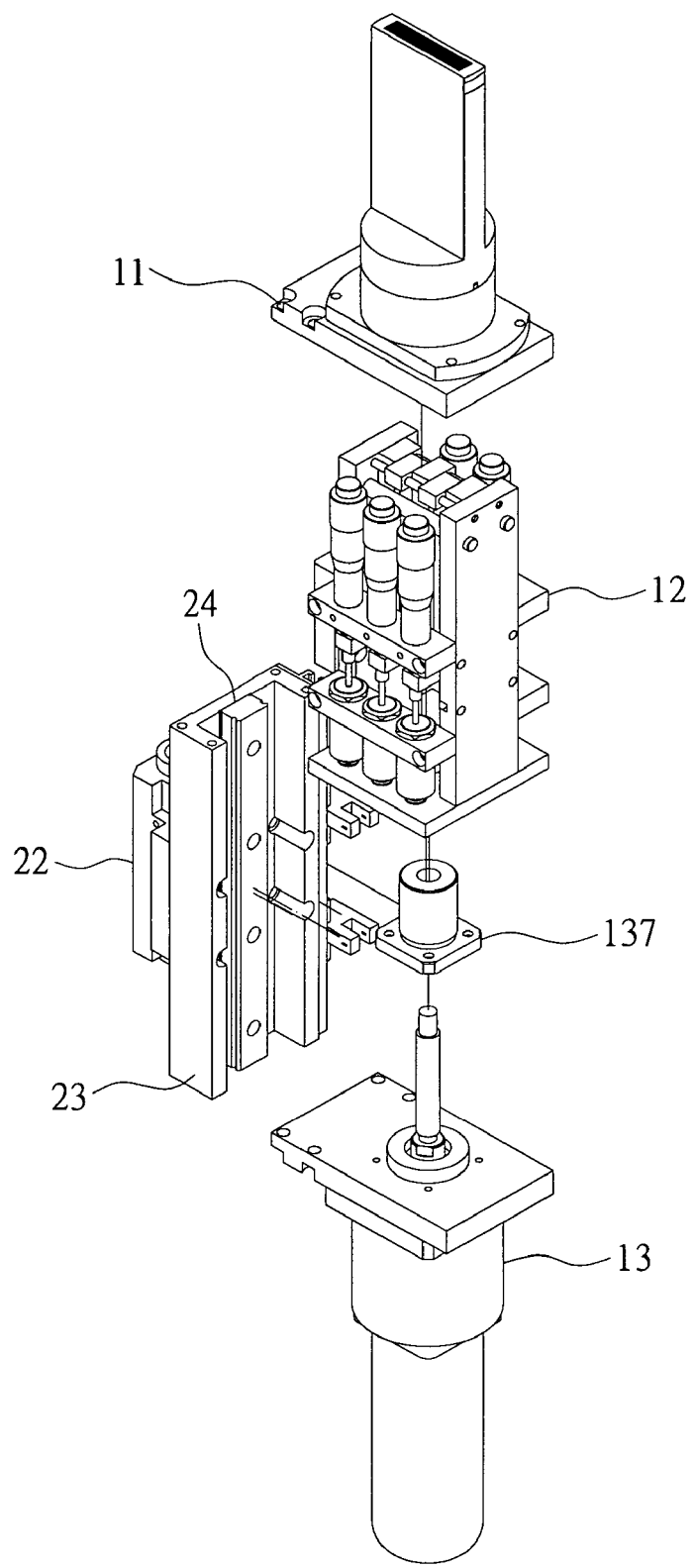
FIG. 3 is a decomposition view of a pin base according to the present invention.
Figure 4:
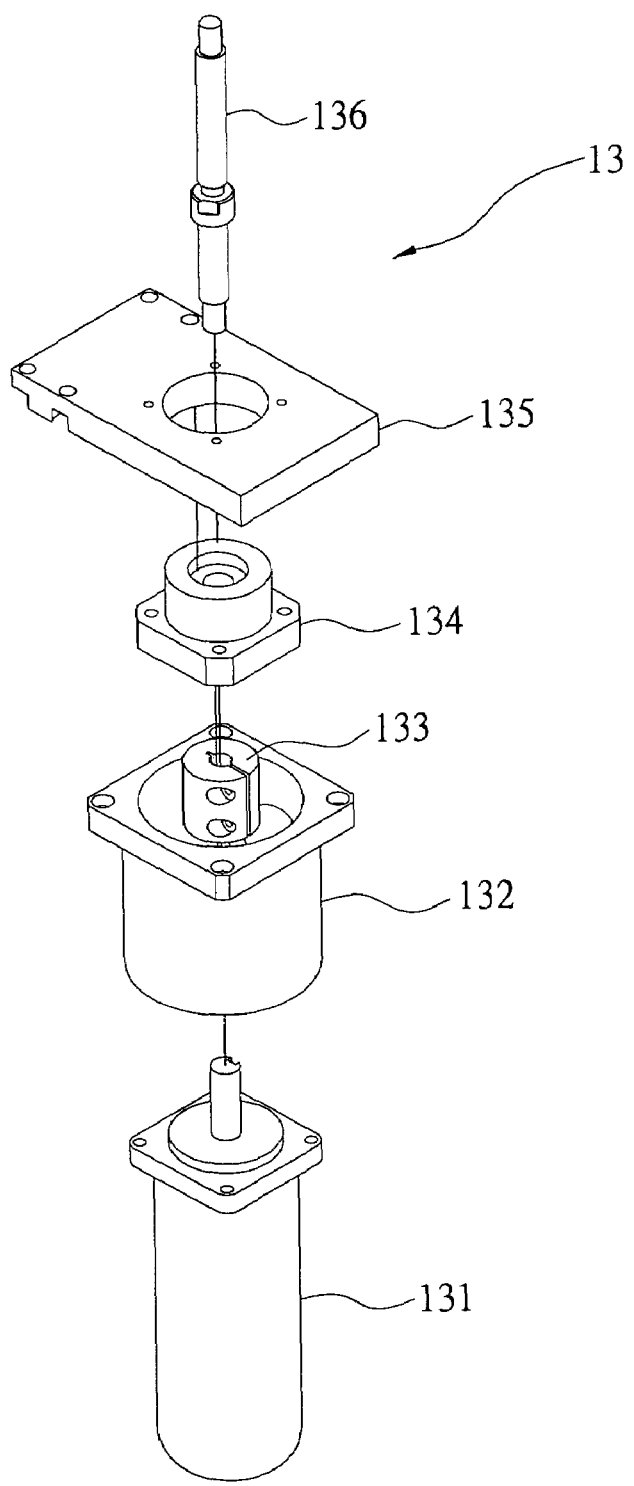
FIG. 4 is a decomposition view of a propelling driver according to the present invention.
Figure 5:
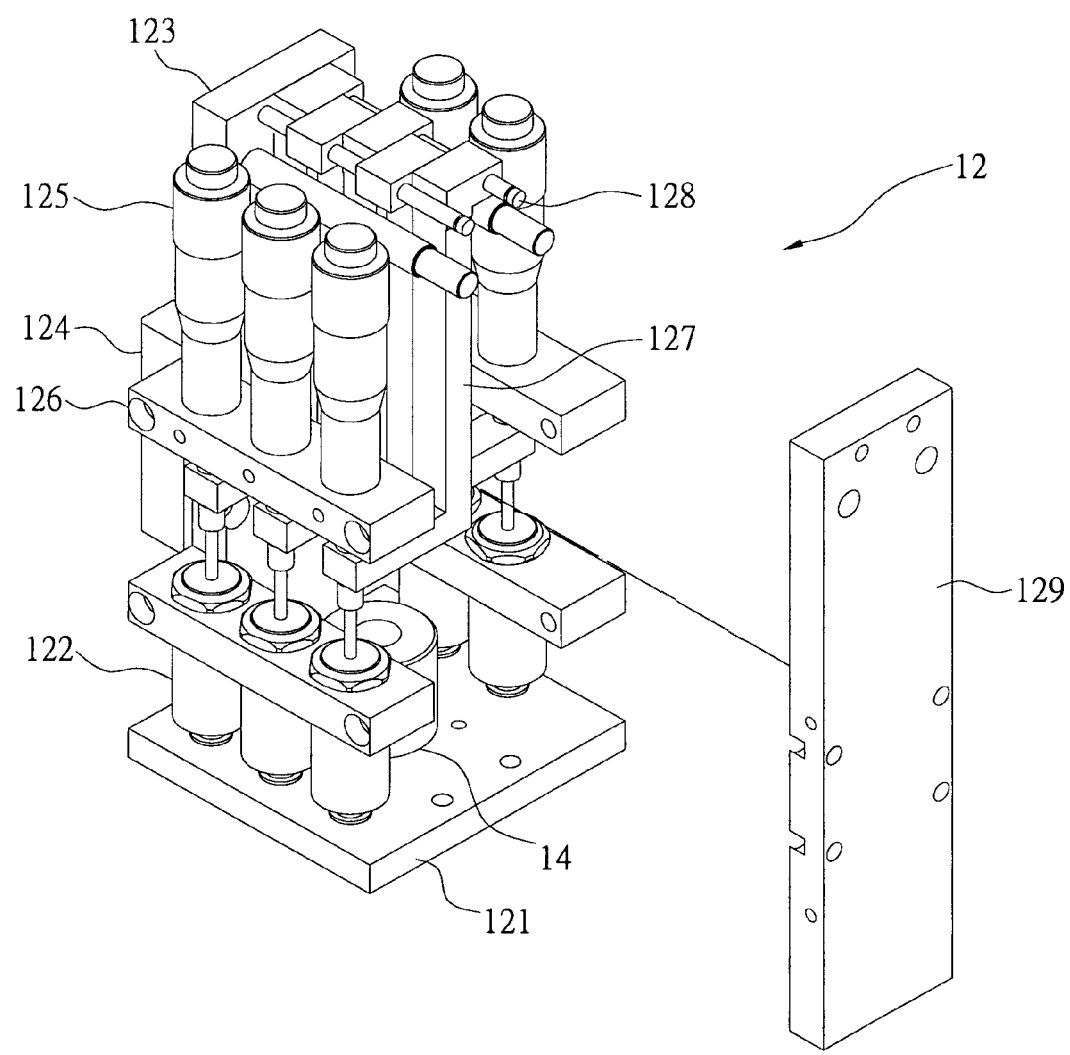
FIG. 5 is a decomposition view of a selection device according to the present invention.
Figure 6:
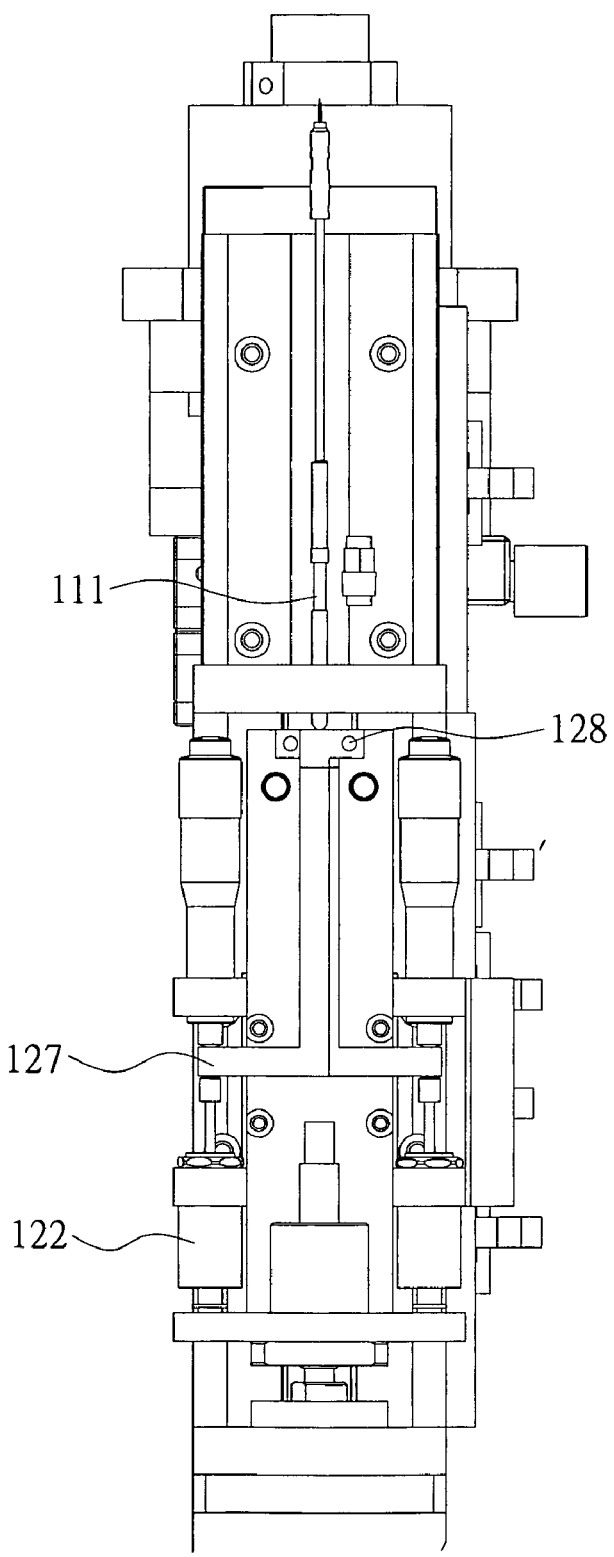
FIG. 6 is a perspective view of the selection device according to the present invention.

In regard to FIG. 3, the pin base 1 includes an inhalation device 11 which sucks the adhesive film, a plurality of ejection pins 111 arranged inside the inhalation device 11, a selection device 12 disposed under the inhalation device 11 and controlling each of the ejection pins 111 individually, and a propelling driver 13 which pushes the selection device 12. The propelling driver 13 includes an ejection motor 131 secured to the pin-base vertical driver 2, a pitch screw 136 which connects onto the ejection motor 131, and a nut 137 which connects to the pitch screw 136 and abuts against the selection device 12; the ejection motor 131 drives the pitch screw 136 to lift or lower the nut 137, and the selection device 12 is lifted or lowered by the ejection motor 131 via the nut 137. Referring to FIG. 4, the ejection motor 131 is disposed on a motor holder 132, and the motor holder 132 and a retaining member 135 both connect to the mold plate 23. The mold plate 23 is lifted and lowered by the pin-base vertical driver 2, so as to lift and lower the ejection motor 131. The ejection motor 131 connects to an end of the pitch screw 136 via an axial linkage member 133, and the pitch screw 136 connects to the retaining member 135 via a bearing member 134. When the ejection motor 131 drives the pitch screw 136, the pitch screw 136 can revolve on its own axis. The selection device 12 is abutted against by the nut 137 and connects to the propelling driver 13. When the pitch screw 136 revolves, the nut 137 is driven to elevate, the selection device 12 elevates along a sliding path 24 formed on the mold plate 23, so that the selection device 12 can move linearly relative to the propelling driver 13 for forcing the ejection pins 111 upwardly. With respect to FIGS. 5 and 6, the selection device 12 includes a basic plate 121, a plurality of electromagnetic pitch screws 122 corresponding to the ejection pins 111 respectively and disposed on the basic plate 121, two vertical plates 123 and 129 connecting the basic plate 121, a module block 124 sliding the mold plate 23, a plurality of bolts 125 arranged to the electromagnetic pitch screws 122 drive respectively to adjust for the same level height, an orientation bump 126 fixing the bolts 125, a plurality of actuating rods 127 controlling the electromagnetic pitch screws 122 respectively, and a revolving axle 128 which connect the actuating rods 127 and the two vertical plates 123 and 129, whereby the actuating rods 127 turns around the revolving axle 128, the actuating rods 127 are lifted while the electromagnetic pitch screws 122 drive upwardly, or the actuating rods 127 are lowered to the surfaces of the electromagnetic pitch screws 122 by gravity while the electromagnetic pitch screws 122 drive downwardly. FIG. 6 illustrates more details about the selection device 12, when one of the electromagnetic pitch screws 122 is at the upper dead point, the respective actuating rod 127 turns about the revolving axle 128 and approaches to abut against the respective bolt 125 due to the force of the electromagnetic pitch screws 122. This elevates the respective ejection pin 111. When the electromagnetic pitch screws 122 is at the lower dead point, the respective actuating rod 127 is acted upon by the pull of gravity and a spring sleeved thereon, the respective actuating rod 127 descends to contact with the electromagnetic pitch screws 122, and the respective ejection pin 111 descends by the carry of the respective actuating rod 127. The quantity of the electromagnetic pitch screws 122 can be chosen for different ejection pins 111, and each of the ejection pins 111 can be lowered or lifted individually, thus specific dies can be removed from the adhesive film. The bolts 128 can be used to adjust various upper dead point of each ejection pin 111, in order to make all the ejection pins 111 have the same height level.

Figure 7A:
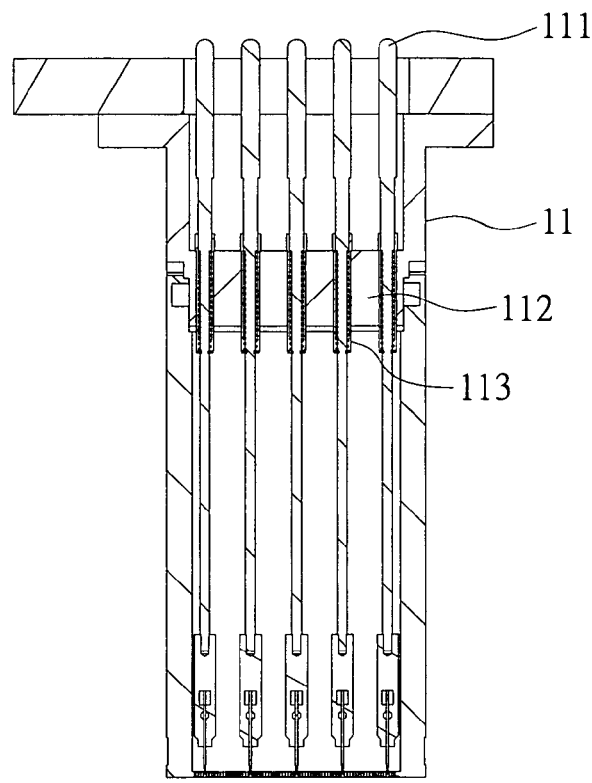
FIG. 7A is a side view of a inhalation device according to the present invention.
Figure 7B:
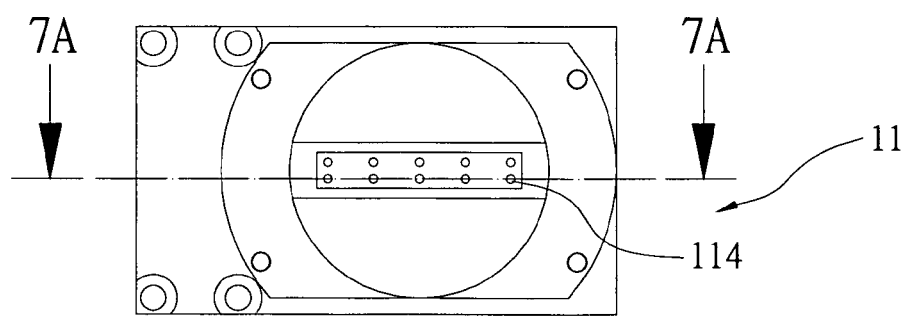
FIG. 7B is a top view of the inhalation device according to the present invention.
Figure 8:
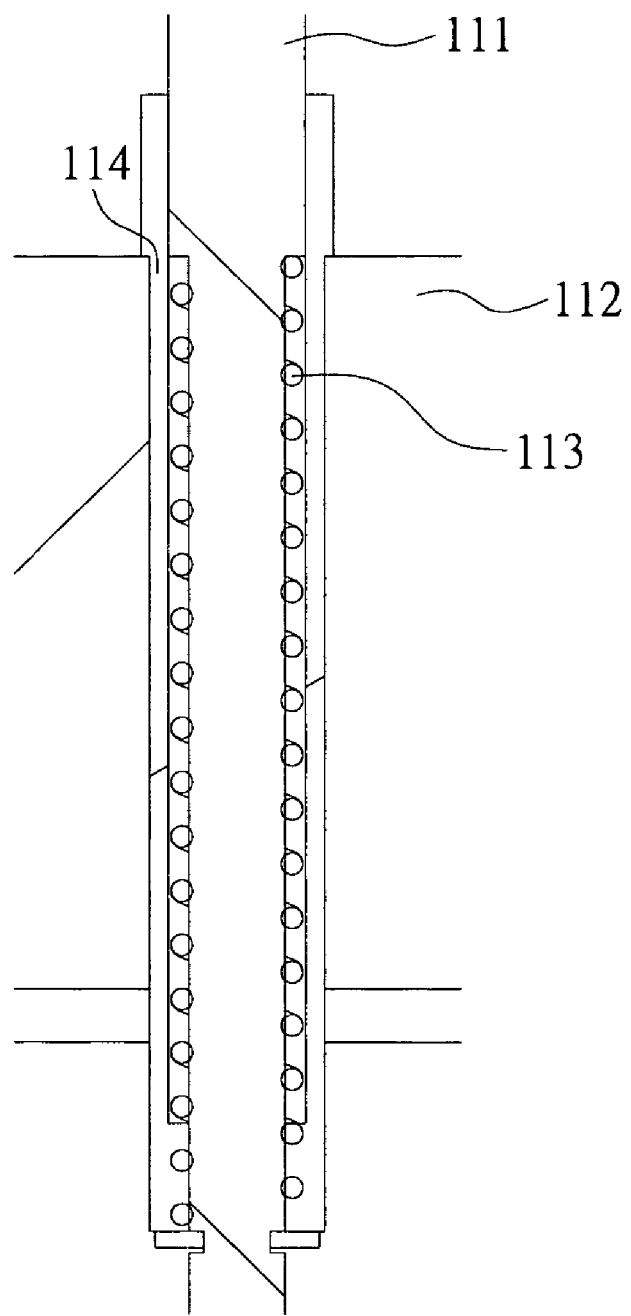
FIG. 8 is a side view of plurality of ejection pins according to the present invention.

Illustrated in FIGS. 7A, 7B and 8, the inhalation device 11 includes a plurality of springs 113 sleeved on the ejection pins 111, a secure member 112 connecting therein to orientate the springs 113, and a plurality of holes 114 formed on a top thereof for receiving the ejection pins 111 respectively. When the inhalation device 11 is inhaled by a vacuum pump, the adhesive film will be sucked by the inhalation device 11;

meanwhile, the chosen ejection pins 111 are lifted through the holes 114 to elevate the dies in order to separate the dies from the tightly stretched adhesive film. The spring 113 is arranged to the secure member 112. When the electromagnetic pitch screw 122 is at the upper dead point, the respective ejection pin 111 is chosen to be elevated. Similarly, when the chosen electromagnetic pitch screw 122 is at the lower dead point, the respective ejection pin 111 is chosen to descend by the recovery force of the spring 113.

Thus, the selection device 12 chooses a predetermined quantity of ejection pins 111, when the propelling device 13 lifts the selection device 12, the pin-base vertical driver 2 controls the vertical motion of the pin base 1, and the pin-base motion device 3 controls the planar motion of the pin base 1; the chosen ejection pins 111 can be lifted to elevate the respective dies for separating from the adhesive film.

The advantages of the present invention are:

1. A pin-base motion device is provided to ensure the chosen ejection pins are arranged and positioned properly with their respective dies.

2. A propelling driver which drives the ascent or the descent of the ejection pins to match up with a wafer table, and ensures the adhesive film is stretched tightly while the dies are removed therefrom.

3. A selection device chooses the desired ejection pins 111, and each of the ejection pins 111 is co-operated with an electromagnetic pitch screw, which decides whether the ejection pin should be lifted or not.

4. The dies are removed from the adhesive film in order to arrange them on a reel adhesive film, allowing a pick and place machine to be omitted thereby making the process more efficient.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An ejector with multi-ejection pins for lifting a plurality of dies outwards in order to separate from an adhesive film, and the ejector comprising:
   a pin base including:
   an inhalation device for sucking the adhesive film;
   a plurality of ejection pins arranged inside the inhalation device;
   a selection device disposed under the inhalation device and controlling each of the ejection pins individually; and
   a propelling driver forcing the selection device;
   a pin-base vertical driver connecting the pin base and controlling the pin base for controlling the elevation and the descent of the ejector pins; and
   a pin-base motion device connecting the pin base and controlling the pin base to align the ejection pins with the respective dies;
   wherein the selection device chooses a predetermined quantity of ejection pins individually, the propelling driver elevates the selection device, the pin-base vertical driver controls the pin base to move vertically, and the pin-base motion device controls the pin base to rotate and move along a two-dimensional plane;
   whereby the inhalation device sucks the adhesive film on a surface thereof, the selection device chooses the respective ejection pins and pushes the chosen ejection pins upwardly via the propelling driver, so as to force the chosen ejection pins to lift the adhesive film for removing the die.

2. The ejector as claimed in claim 1, wherein the pin-base motion device includes a XY table, an axial member arranged on the XY table, a connection member pivoting to the axial member and disposed on a lateral side of the pin-base vertical driver, and an adjust screw driving the connection member to rotate about the axial member.

3. The ejector as claimed in claim 1, wherein the pin-base vertical driver includes a vertical driving motor, an orientation member connecting to the pin-base motion device, and a mold plate connected to the pin base.

4. The ejector as claimed in claim 1, wherein the inhalation device includes a plurality of springs sleeved on the ejection pins, a secure member connecting therein to orientate the springs, and a plurality of holes formed on a top thereof for receiving the ejection pins respectively.

5. The ejector as claimed in claim 1, wherein the inhalation device is inhaled by a vacuum pump.

6. The ejector as claimed in claim 1, wherein the selection device includes a plurality of electromagnetic pitch screws corresponding to the ejection pins respectively, a plurality of actuating rods controlling the electromagnetic pitch screws respectively, and a revolving axle connecting the actuating rods and a basic plate; whereby the actuating rods rotate about the revolving axle, the actuating rods are lifted while the electromagnetic pitch screws drive upwardly, or the actuating rods are lowered by the gravity while the electromagnetic pitch screws drive downwardly.

7. The ejector as claimed in claim 6, wherein the selection device includes a plurality of bolts arranged to the electromagnetic pitch screws to respectively drive and adjust to achieve the same height.

8. The ejector as claimed in claim 1, wherein the propelling driver includes an ejection motor, a pitch screw connected on the ejection motor, and a nut connected to the pitch screw and abutted against the selection device; the ejection motor drives the pitch screw to lift or lower the nut.

* * * * *